(12) United States Patent
Cheng

(10) Patent No.: US 7,253,113 B2
(45) Date of Patent: Aug. 7, 2007

(54) METHODS FOR USING A SILYLATION TECHNIQUE TO REDUCE CELL PITCH IN SEMICONDUCTOR DEVICES

(75) Inventor: Yang Chin Cheng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/713,762

(22) Filed: Nov. 13, 2003

(65) Prior Publication Data

US 2005/0106870 A1 May 19, 2005

(51) Int. Cl.
 *H01L 21/311* (2006.01)
(52) U.S. Cl. ............. 438/703; 438/734; 438/737; 257/E21.026
(58) Field of Classification Search ........ 438/700–705, 438/725, 734–738; 430/311–318; 257/E21.026, 257/E21.036
See application file for complete search history.

(56) References Cited

U.S. PATENT DOCUMENTS

| | | | |
|---|---|---|---|
| 4,751,170 A * | 6/1988 | Mimura et al. .......... 430/296 |
| 6,001,739 A | 12/1999 | Konishi | |
| 6,294,314 B1 * | 9/2001 | Liao ...................... 430/313 |
| 6,316,168 B1 | 11/2001 | Butt et al. | |
| 6,350,675 B1 * | 2/2002 | Chooi et al. ............ 438/624 |
| 6,429,123 B1 * | 8/2002 | Tseng .................... 438/642 |
| 6,589,714 B2 * | 7/2003 | Maimon et al. ......... 430/313 |
| 2001/0049071 A1 * | 12/2001 | Merritt et al. ........ 430/270.1 |
| 2003/0091936 A1 * | 5/2003 | Rottstegge et al. ...... 430/312 |
| 2003/0224560 A1 * | 12/2003 | Odaka et al. ........... 438/148 |

* cited by examiner

*Primary Examiner*—Thanhha S. Pham
(74) *Attorney, Agent, or Firm*—Stout, Uxa, Buyan & Mullins, LLP

(57) ABSTRACT

A method for forming a semiconductor device having a reduced pitch is provided. The method includes providing a substrate, forming a material layer over the substrate, forming a photoresist layer over the material layer, exposing a top surface of the photoresist layer to radiation, and forming a silylated layer over the photoresist layer. The method further includes removing a portion of the silylated layer to expose the photoresist layer, removing the photoresist layer, removing portions of the material layer using the silylated layer as a mask, and removing another portion of the silylated layer.

17 Claims, 3 Drawing Sheets

Flood exposure

METHODS FOR USING A SILYLATION TECHNIQUE TO REDUCE CELL PITCH IN SEMICONDUCTOR DEVICES

BACKGROUND OF THE INVENTION

1. Field of the Invention

The present invention relates generally to methods for fabricating semiconductor devices and, more particularly, to methods for reducing cell pitch in semiconductor devices.

2. Description of Related Art

The fabrication of semiconductor devices is a complex process, which typically includes a number of photolithography processes. In a typical photolithography process, a photoresist material is deposited over a layer to be patterned and is exposed to a radiation source, such as, for example, ultraviolet radiation, which is projected through a mask that defines the pattern to be formed in the photoresist. The mask only passes radiation to selected regions of the layer to be patterned, resulting in the exposure of the photoresist only at those selected regions. The photoresist is then developed to form a patterned photoresist layer over the underlying layer to be patterned. The portions of the underlying layer left exposed by the photoresist are etched away to define, for example, gate conductors of ensuing transistor devices. The pattern in the photoresist is thus replicated in the underlying layer.

Important advantages are of course achieved by making the semiconductor devices as small as possible. Typical photolithography processes, however, limit the size and density with which semiconductor devices may be fabricated. For example, a minimum resolution capability of a given photolithography process determines the minimum pitch with which features for a patterned layer may be printed using that process. Consequently, the photolithography process limits the minimum achievable widths which can be obtained for those features of such conventional semiconductor devices. It therefore can be difficult to reduce the widths of and distances between, for example, transistor gate conductors that are defined by the photolithography process.

Because of limitations of the photolithography process, the pitch of semiconductor devices, such as for example transistor devices, cannot be easily reduced. The "pitch" is herein defined as the distance between the same points of two adjacent structures of the same type, such as, for example, two adjacent transistor gate conductors. Since the pitch of semiconductor devices cannot be easily reduced, the device density cannot easily be increased to meet the high demand for smaller and faster semiconductor devices. In addition, higher densities translate into lower material costs for the semiconductor devices.

A need thus exists in the prior art to reliably and efficiently reduce the pitch of semiconductor devices. A further need exists to develop methods for fabricating semiconductor devices in which the widths of and distances between adjacent structures of the same type are not limited by the photolithography process.

SUMMARY OF THE INVENTION

The present invention addresses these needs by providing simple and feasible methods for using photoresist silylation techniques to reduce cell pitch in semiconductor devices. The cell pitch of the formed devices can be reduced using current lithography processes to, for example, half that of conventional devices. Since the cell pitch of the semiconductor devices can be reduced, device densities can be increased, resulting in smaller and faster integrated circuits.

In one embodiment, and by way of example only, a method for forming a semiconductor device having a reduced pitch comprises providing a substrate, forming a material layer over the substrate, forming a photoresist layer over the material layer, exposing the photoresist layer to radiation, and forming a silylated layer over the photoresist surface layer. The method further comprises removing a portion of the silylated layer to expose the photoresist layer, removing the photoresist layer, removing portions of the material layer using the silylated layer as a mask, and removing another portion of the silylated layer.

In another embodiment, a method comprises providing a substrate having a first layer formed thereon, forming a second layer on the first layer, performing a flood exposure on the second layer for a predetermined time, and silylanizing the second layer to form a silylated layer over the second layer. The method further comprises removing a first portion of the silylated layer to expose the second layer, removing the second layer, using the silylated layer as an etch mask, removing an exposed portion of the first layer, and removing a second portion of the silylated layer.

In still another embodiment, a method for forming a semiconductor device having a reduced pitch comprises forming a material layer on a substrate, forming a patterned photoresist layer on the material layer, exposing the patterned photoresist layer to ultraviolet radiation to alter at least one property of the patterned photoresist layer so that a portion of the patterned photoresist layer becomes a depolymerized layer, and silylanizing the depolymerized layer in a gas phase or in a liquid phase to form a silylated layer over the patterned photoresist layer. The method further comprises removing a first portion of the silylated layer to expose the patterned photoresist layer using an etching back process or a chemical mechanical planarization process, removing the patterned photoresist layer using a plasma gas, using the silylated layer as an etch mask to remove an exposed portion of the material layer, and removing a second portion of the silylated layer to form a plurality of structures having a pitch that is smaller than a photolithography process will allow.

Any feature or combination of features described herein is included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
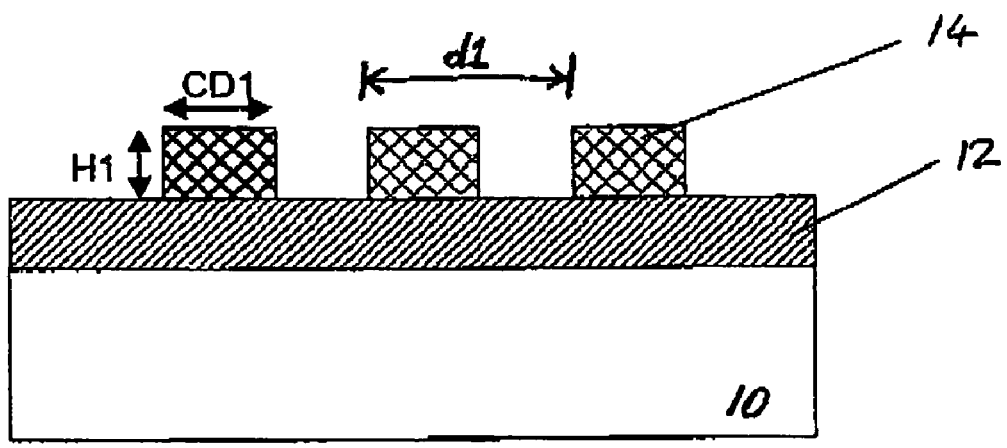
FIG. 1 is a cross-sectional view of a substrate having a material layer formed thereon, and a patterned photoresist layer formed on the material layer in accordance with an illustrated embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of semiconductor devices having reduced cell pitches. The present invention may be practiced in conjunction with various photolithography techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to methods for using a silylation technique to reduce the cell pitch in semiconductor devices.

Referring more particularly to the drawings, FIG. 1 is a cross-sectional view of a substrate 10 having a material layer 12 formed thereon, and a photoresist layer 14, such as a patterned photoresist layer, formed on the material layer 12. Hence, the material layer 12 and the photoresist layer 14 are sequentially formed on the substrate 10. Preferably, the substrate 10 is made of a single crystalline silicon material. Alternatively, the substrate 10 can be made of materials such as gallium nitride (GaN), gallium arsenide (GaAs), or other materials commonly recognized as suitable semiconductor materials to those skilled in the art.

The material layer 12 is preferably made of a material, which can be selected, as desired, for a particular semiconductor application or structure. For example, the material layer 12 may comprise a semiconductor compound which can be selected from any of the Group IIIA and VA elements (III-V semiconductor compounds), mixed III-V compounds, Group IIA or IIB and VIA elements (II-VI semiconductor compounds), mixed II-VI compounds, and combinations thereof. Examples may include silicon (Si), silicon dioxide ($SiO_2$), doped $SiO_2$, silicon nitride (SiN), polysilicon ($Si_2$), aluminum (Al), titanium (Ti), titanium nitride (TiN), tantalum (Ta), tantalum nitride (TaN), copper (Cu), aluminum/copper (AlCu), polymeric resins, dielectric anti-reflective coating (DARC), bottom anti-reflective coating (BARC), development anti-reflective coating (DeBARC), and any combination of these various materials.

In modified embodiments, however, the material layer 12 may comprise other semiconductor materials, metals, or non-metal materials that can be used in the formation of semiconductor devices, structures and/or integrated circuits. In one embodiment, the material layer 12 may be formed on the substrate 10 by a thermal process such as thermal oxidation. In one embodiment, during thermal oxidation, the substrate 10 is exposed to thermal radiation in an oxygen bearing ambient to form the material layer 12 on the substrate 10. Alternatively, the material layer 12 may be deposited onto the substrate 10 using conventional thin film deposition methods such as, for example, chemical vapor deposition (CVD). The material layer 12 may have a substantially uniform thickness ranging from about 40 angstroms (Å) to about 8000 Å, and preferably has a substantially uniform thickness of about 1200 Å. In the illustrated embodiment, the material layer 12 comprises SiO2/poly having a thickness of about 80/1200 Å, and the patterned photoresist layer 14 has a thickness of about 4200 Å.

The photoresist layer 14 is formed on the material layer 12 using, for example, a photolithography process. The photoresist layer 14 can be a negative photoresist, a positive photoresist, a negative e-beam photoresist, or a positive e-beam photoresist. In the illustrated embodiment, the photoresist layer 14 comprises a positive photoresist. Also known as radiation-softening photoresist, positive photoresist can be depolymerized by exposure to radiation such as UV radiation. With positive photoresist, areas exposed to radiation are dissolved upon placement in a developer, while the masked, unexposed areas remain unaffected. To form the photoresist layer 14, a layer of photoresist is first spun onto the material layer 12. After the photoresist baking process the substrate 10 is then placed into a patterning tool known as a stepper or scanner where it is aligned to a mask plate and exposed to ultraviolet (UV) radiation. The mask plate may only be large enough to cover a small portion of the substrate 10, in which case the stepper steps or scanner scans the substrate 10 through many quadrants, each of them being exposed in turn until the entire or desired portion of the substrate 10 has been exposed to UV radiation. After the post exposure baking, the substrate 10 is then placed in a developer solution that dissolves depolymerized portions of the photoresist that were exposed to the UV radiation, thereby yielding the patterned photoresist layer 14.

In the illustrated embodiment, features of the patterned photoresist layer 14 have a height "H1" of about 4200 Å and a width "CD1" of about 1600 Å. Also, in the illustrated embodiment, the minimum pitch size "d1" of the patterned photoresist layer 14 is as small as the photolithography process will allow. For example, the minimum pitch size d1 may be 300 Å. The width, height and/or pitch size "d1" may comprise other dimensions in other embodiments.

Figure 2:
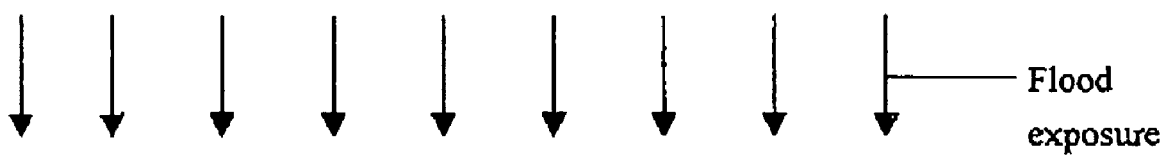
FIG. 2 is a cross-sectional view of the configuration depicted in FIG. 1 further illustrating a flood exposure process being performed on the patterned photoresist layer in accordance with an illustrated embodiment of the present invention.
Figure 2:
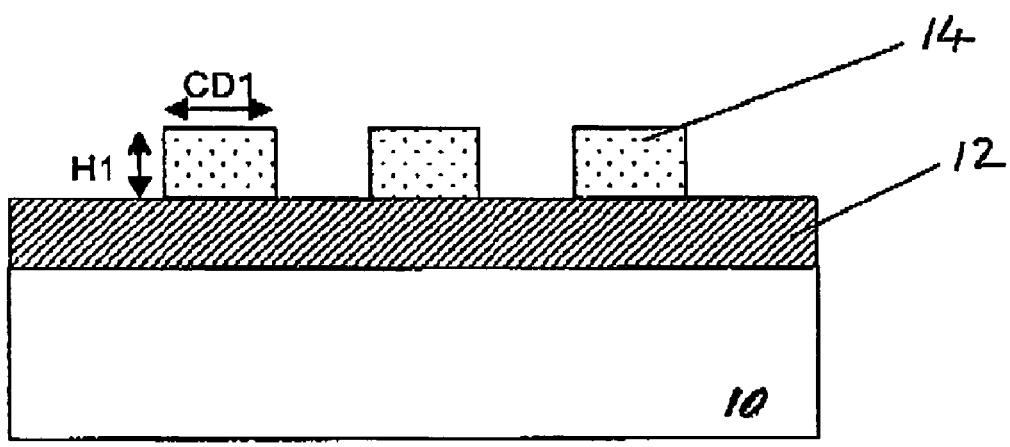

FIG. 2 is a cross-sectional view of the configuration depicted in FIG. 1 further illustrating an exposure process being performed on the patterned photoresist layer 14. The exposure process alters or converts at least one property of the patterned photoresist layer 14 so that, for example, portions of the patterned photoresist layer 14 can change from a cross-linked polymer state to a less cross-linked polymer state. Thus, in accordance with an aspect of the present invention, a flood exposure treatment is performed to alter at least the cross-link degree of the photoresist layer 14. The silation agent will more easy diffuse into the polymer of reduced cross-link degree.

In FIG. 2 a flood exposure to ultraviolet radiation is performed to depolymerize the patterned photoresist layer 14 for a change of the polymer cross-link degree. This process can be accomplished by flood exposure of the patterned photoresist layer 14 to, for example, deep ultraviolet radiation (below 2480 Å) followed by a heat treatment step. The exposure can be conducted substantially perpendicularly to the patterned photoresist layer 14, as shown, for a predetermined time and dosage so that a top surface of the patterned photoresist layer 14 is, for example, is completely exposed. In one embodiment, the dosage of ultraviolet radiation can be, for example, from about 30 mJ/cm$^2$ to about 200 mJ/cm$^2$, and the exposure energy can be about 50 mJ/cm$^2$. The heat treatment can be conducted at a temperature of from about 90 C. to about 150 C. and for a duration of time ranging from about 1 minute to about 5 minutes.

As presently embodied, the treatment comprises a silylation of the patterned photoresist layer 14, comprising a diffusion process of, for example, silylating agent diffusion into an outer portion of the patterned photoresist layer 14. In such embodiments wherein silicon is employed, the silylating agent can comprise, for example, silylamine (dimethysilydimethyamine, dimethylaminopentamethyldisilane, dimethylsilydiethylaine or bis(dimethylamino)dimethylsilane, etc.). The silylating agent, which may be implemented as a silicon-containing vapor or liquid, can provide increased etch resistance by contributing silicon to the patterned photoresist structure. In a preferred embodiment, the silyating process can be processed at a temperature of from 90 C. to about 150 C. and for a duration of time ranging from 1 minute to about 20 minutes for the vapor phase silylating agent. For the liquid phase silylating agent, the silyating process can be processed at a temperature of from 15 C. to about 30 C. and for a duration of time ranging from 1 minute to about 20 minutes. The silyation diffusion process is preferably adjusted such that a silylated layer 18 is formed having a penetration depth (i.e., silylated layer thickness "t") less than the thickness of the patterned photoresist layer 14 and, as illustrated, less than a height "H2" so that a remaining unsilylated patterned photoresist layer 16 having a height "H3" remains.

Figure 3:
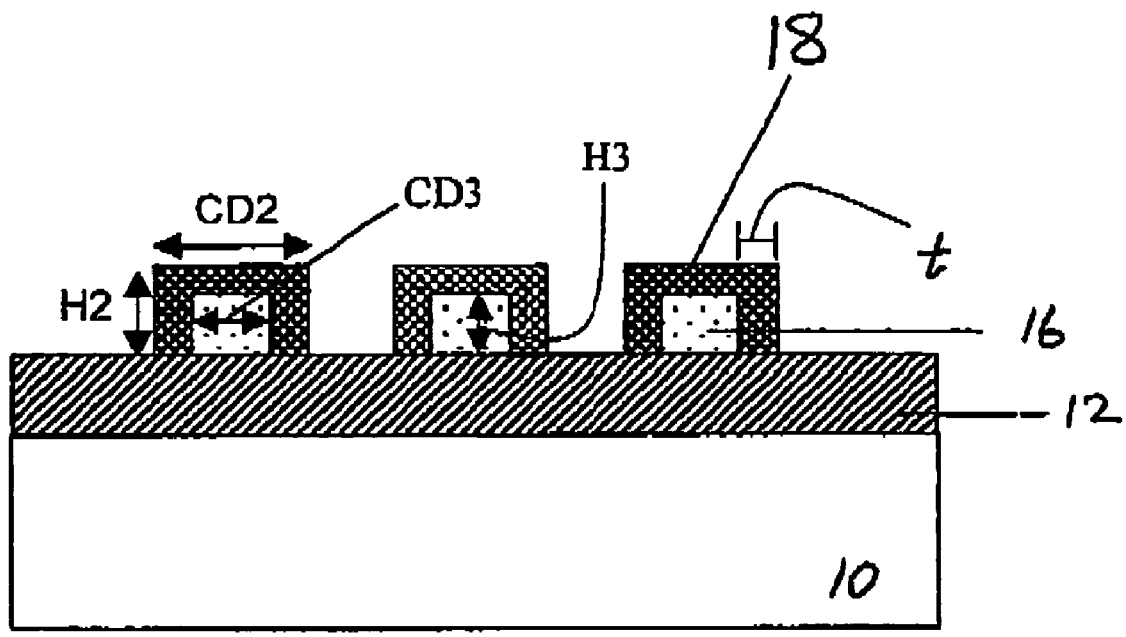
FIG. 3 is a cross-sectional view of the configuration depicted in FIG. 2 wherein the depolymerized layer is silylanized to form a silylated layer over the patterned photoresist layer in accordance with an illustrated embodiment of the present invention.

As a result of the silyation process, a surface portion of the unsilylated patterned photoresist layer 16 is silylanized to form a silicon enriched photoresist layer or silylated layer 18 over the unsilylated patterned photoresist layer 16 to yield the structure shown in FIG. 3. In accordance with the present invention, the silylated layer 18 will allow the cell pitch to be reduced beyond that obtainable using typical photolithography processes. The silylated layer 18 can have a thickness "t" of about 600 Å. As presently embodied, the patterned photoresist layer 14 remaining beneath the silylated layer 18 is formed to a height "H3" of about 3800 Å and a width "CD3" of about 900 Å which forms the unsilylated patterned photoresist layer 16. In accordance with one embodiment of the present invention, the height "H1" is greater than the height "H3" and the width "CD1" is greater than the width "CD3". In the illustrated embodiment, the resulting structures, which are covered by the silylated layer 18, have a height "H2" of about 4400 Å and a width "CD2" of about 2100 Å. Moreover, in accordance with one embodiment of the present invention, the height "H2" is greater than the height "H1", the width "CD2" is greater than the width "CD1", the width "CD2" is approximately equal to the width "CD3" plus 2 times the thickness "t", and the height "H2" is approximately equal to the height "H3" plus the thickness "t".

Figure 4:
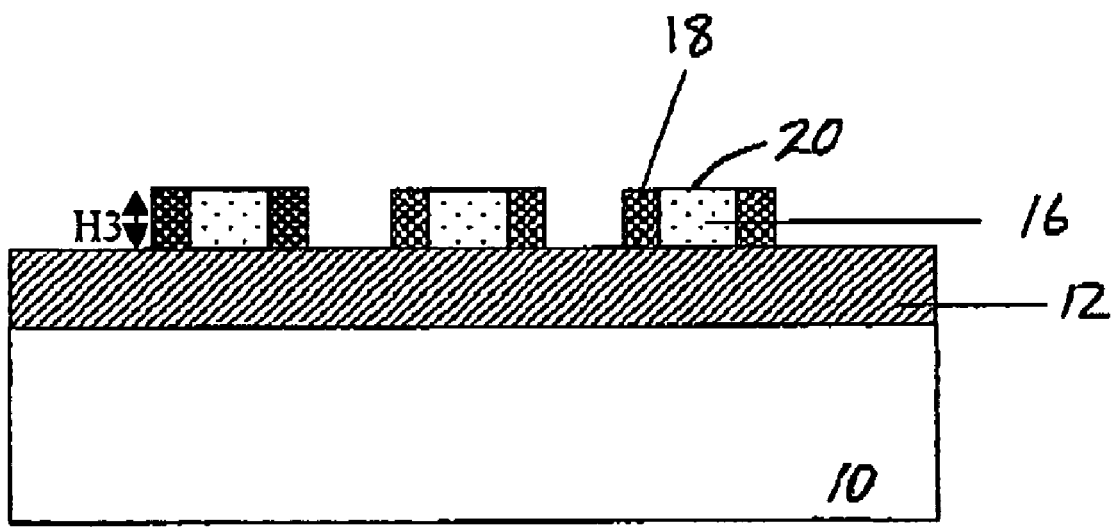
FIG. 4 is a cross-sectional view of the configuration depicted in FIG. 3 wherein a top portion of the silylated layer is removed to expose a top surface of the unsilylated patterned photoresist layer using an etching back technique or a conventional abrasive technique such as a chemical mechanical planarization in accordance with an illustrated embodiment of the present invention.

The top portion of the silylated layer 18 is next removed, for example, planarized, to expose a top surface 20 of the unsilylated patterned photoresist layer 16 using, for example, an etching back technique or a conventional abrasive technique such as a chemical mechanical polishing (CMP) process to form the structure shown in FIG. 4. For example, a CMP process can be performed to remove the top portion of the silylated layer 18 and expose the top surface 20 of the unsilylated patterned photoresist layer 16. The silylated layer 18 is eroded for a time sufficient to completely remove the top portion of the silylated layer 18, at which point the CMP process is terminated before substantial portions of the unsilylated patterned photoresist layer 16 are removed. In modified embodiments, additional eroding of the silylated layer 18 and portions of the unsilylated patterned photoresist layer 20 may occur. The CMP process, however, may allow for greater control to remove material only down to the top surface 20 by controlling the depth of the planarization. Other methods to remove the top portion of the silylated layer 18 may include dry or wet etching, or other etching processes. The various processes that can be implemented are well-known techniques to those skilled in the art.

Figure 5:
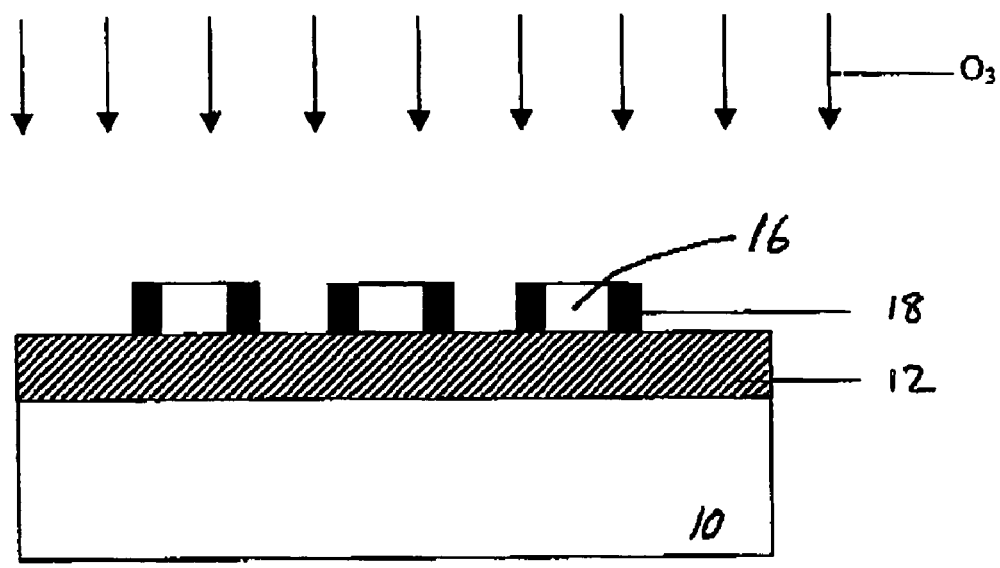
FIG. 5 is a cross-sectional view of the configuration depicted in FIG. 4 wherein the unsilylated patterned photoresist layer is removed using a dry stripping technique in accordance with an illustrated embodiment of the present invention.

Thereafter, as shown in FIG. 5, the unsilylated patterned photoresist layer 16 is removed, using for example a plasma etching. Plasma etching is preferred because it can be performed anisotropically, leaving sharper edge profiles. In the illustrated embodiment, plasma etching is accomplished with an oxygen-containing etch gas. The plasma source gas may vary in composition and may comprise, for example, oxygen ($O_2$). The process steps may include, for example, a first step of using $C_2F_6$ plasma, a main etching step using $O_2$—$SO_2$ plasma, and an over-etching step. While such plasma etching will degrade the unsilylated patterned photoresist layer 16, the silylated layer 18 will become $SiO_2$ rich polymer and be more resistant to the plasma etching. Silylation can be particularly advantageous for imparting etch resistance to the patterned photoresist layer 14 when oxygen plasma is used in the ensuing etching process as described herein. For example, photoresist, which has been silylated in accordance with the method described herein, can exhibit an etch rate in oxygen plasma of less than about 50% of the etch rate of the unsilylated patterned photoresist 14. Hence, the silylated layer 18 can both be formed into thinner layers and produce sharper images as compared to typical techniques of the prior art.

The unsilylated patterned photoresist layer 16 is etched for a time sufficient to completely remove the unsilylated patterned photoresist layer 16, at which point the removal technique is terminated before substantial portions of the material layer 12 are removed. As presently embodied, removal of the unsilylated patterned photoresist layer 16 exposes portions of the material layer 12.

Figure 6:
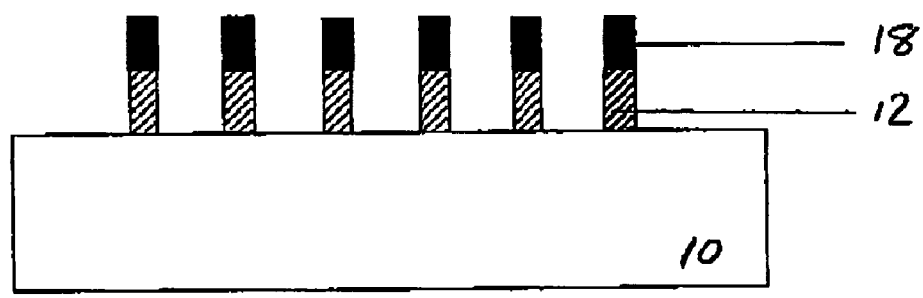
FIG. 6 is a cross-sectional view of the configuration depicted in FIG. 5 wherein the material layer is etched using the silylated layer as an etch mask in accordance with an illustrated embodiment of the present invention.

Next, using the silylated layer 18 as an etch mask, the material layer 12 is etched with an etchant having a higher selectivity for the material layer than for the treated (e.g., silylated) layer 18 to yield the construction shown in FIG. 6. Specifically, as presently embodied, the etching is performed on the material layer 12 with a condition that the etch rate of the material layer 12 is higher than the etch rate of the silylated layer 18, and is stopped when the upper surface of the substrate 10 is exposed. This process may be similar to etching the material layer 12 using the substrate 10 as an etch stopper.

Figure 7:
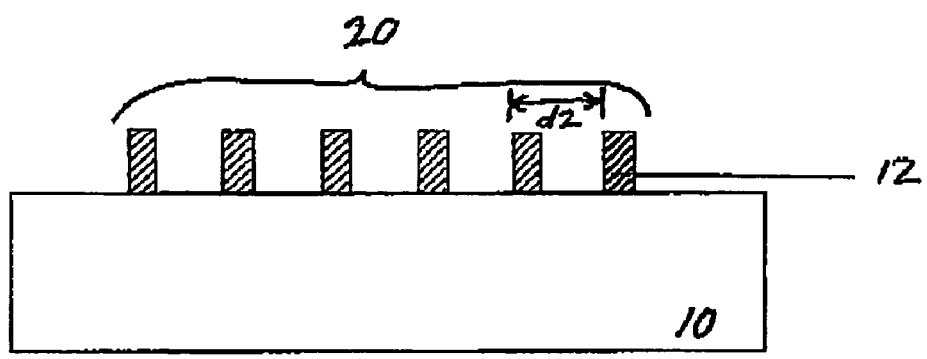
FIG. 7 is a cross-sectional view of the configuration depicted in FIG. 6 wherein the silylated layer is removed using a wet stripping technique resulting in the formation, of a plurality of structures having a reduced pitch in accordance with an illustrated embodiment of the present invention.

The silylated layer 18 can then be removed using, for example, a wet etching technique using, for example, dilute HF(200:1) then H4SO4+H2O2 then NH4OH/H2O2/DI water, resulting in the formation of a plurality of structures 20 having a reduced pitch, as depicted in FIG. 7. Specifically, as presently embodied, the etching is performed on the silylated layer 18 on the condition that the etch rate of the silylated layer 18 is higher than the etch rate of the substrate 10 (and, in one embodiment, also higher than the etch rate of the material layer 12), and is stopped when the upper surfaces of the material layer 12 (and, in one embodiment, of the substrate 10 to the extent not already exposed before the etch) are exposed. This is similar to etching the silylated layer 18 using the material layer 12 and the substrate 10 as an etch stopper. Following the removal of the silylated layer 18, transistor devices may be formed, for example, by implanting dopants into the source/drain junctions of the substrate 10, which are located between the plurality of structures 20. In a preferred embodiment, the spacing between pairs of adjacent structures 20 is relatively constant. The distance "d2" represents the pitch of the structures 20, and thus of ensuing transistor devices formed in accordance with an implementation of the present invention. A comparison of pitch "d1" in FIG. 1 and pitch "d2" in FIG. 7 reveals that pitch "d2" is about half of pitch "d1". Moreover, it can also be seen from a comparison of FIG. 1 and FIG. 7 that a lateral width of each structure is substantially less than a minimum lateral width that the photolithography process will allow. Therefore, the present invention can provide a method for forming transistor devices having less pitch than the pitch of conventional transistor devices formed using current photolithography conditions. Since the pitch of the devices can be reduced, the device density can be increased.

In view of the foregoing, it will be understood by those skilled in the art that the methods of the present invention can facilitate formation of semiconductor devices and, more particularly, to methods for using a silylation technique to reduce the cell pitch in semiconductor devices. The above-described embodiments have been provided by way of example, and the present invention is not limited to these examples. Multiple variations and modifications to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method for forming a semiconductor device, the method comprising:
   providing a substrate;
   forming a material layer over the substrate;
   forming a photoresist layer over the material layer;
   exposing a top surface of the photoresist layer to a treatment radiation to generate separate photoresist structures having first distances between corresponding points of the separate photoresist structures defining a first pitch;
   performing an ultraviolet radiation exposure to reduce a cross-linked polymer state of the separate photoresist structures:
   forming a protectant layer over the separate photoresist structures using a diffusion silylation process;
   removing a portion of the protectant layer to expose an underlying portion of The photoresist layer;
   removing the photoresist layer to form at least part of the protectant layer into separate protectant structures having second distances between corresponding points of the separate protectant structures defining a second pitch, the second pitch being less than the first pitch; and
   removing portions of the material layer using the separate protectant structures as a mask.

2. The method as set forth in claim 1, wherein:
   the treatment radiation comprises light radiation;
   the protectant layer comprises a silylated layer; and
   the method comprises an additional step of removing the separate protectant structures.

3. The method as set forth in claim 2, wherein the photoresist layer is positive photoresist.

4. The method as set forth in claim 2, wherein the photoresist layer is positive e-beam photoresist.

5. The method as set faith in claim 2, wherein the exposing of the photoresist layer to treatment radiation comprises performing a flood exposure process to alter at least one property of the photoresist layer.

6. The method as set forth in claim 2, wherein the forming a silylated layer over the separate photoresist structures comprises silylanizing a surface of the separate photoresist structures.

7. The method as set faith in claim 6, wherein the silylanizing of a surface of the separate photoresist structures comprises a silylation process being performed in a gas phase.

8. The method as set forth in claim 2, wherein the material layer is selected from a group consisting of silicon, silicon dioxide, doped silicon dioxide, silicon nitride, poly silicon, aluminum, copper, titanium, titanium nitride, tantalum, and tantalum nitride.

9. A method comprising:
   providing a substrate having a first layer formed thereon;
   forming a second layer on the first layer, the second layer comprising photoresist;
   performing a treatment on the second layer to form at least part of the second layer into separate structures having first distances between corresponding points of the separate structures defining a first pitch, reducing a cross-linked polymer state of the separate structures using ultraviolet radiation, and performing silylation to form a protection layer over the separate structures;
   removing a first portion of the protection layer to expose the separate structures;
   removing the separate structures to form at least part of the protection layer into separate protection structures having second distances between corresponding points of the separate protection structures defining a second pitch less than the first pitch; and using the separate protection structures as an etch mask, removing an exposed portion of the first layer.

10. The method as set forth in claim 9, wherein:
the treatment comprises a flood exposure;
the protection layer comprises a silylated layer; and
the method comprises an additional step of removing the separate protection structures.

11. The method as set forth in claim 10, wherein:
the first layer is a material layer; and
the flood exposure comprises exposure to ultraviolet radiation and is performed substantially perpendicularly to the second layer so tat a top surface of the second layer is exposed to the ultraviolet radiation.

12. The method of claim 10, wherein:
the silylanizing of the second layer is performed in a gas phase or in a liquid phase;
the removing of the first position of the silylated layer to expose the second layer comprises using an etching back process or a chemical mechanical planarization process; and
the removing of the first portion of the silylated layer does not remove a substantial portion of the second layer.

13. The method of claim 10, wherein:
the silylanizing of the second layer is performed in a gas phase or in a liquid phase;
the removing of the first portion of the silylated layer to expose the second layer comprises using a dry etching process or a wet etching process;
the removing of the second layer comprises using a dry stripping process or a wet stripping process; and
the removing of the second layer does not remove a substantial portion of the first layer.

14. The method of claim 10, wherein the removing of the separate protection structures forms a plurality of structures having a pitch that is smaller than a photolithography process will allow.

15. The method of claim 10, wherein the removing of the separate protection structures does not remove a substantial portion of the substrate.

16. A method for forming a semiconductor device having a reduced pitch, the method comprising:
forming a material layer on a substrate;
forming on the material layer a patterned photoresist layer of separate photoresist structures having first distances between corresponding points of the separate photoresist structures defining a first pitch;
exposing the patterned photoresist layer to ultraviolet radiation to alter at least one property of the patterned photoresist layer so that a cross-link degree of a portion of the patterned photoresist layer is reduced;
silylanizing the patterned photoresist layer in a gas phase or in a liquid phase by diffusing silylamine into the patterned photoresist layer and forming a silylated layer over the surface;
removing a first portion of the silylated layer to expose the patterned photoresist layer using an etching back process or a chemical mechanical planarization process;
removing the patterned photoresist layer using a plasma gas to form at least part of the silylated layer into separate silylated structures having second distances between corresponding points of the separate silylated structures defining a second pitch, the second pitch being less than the first pitch;
using the separate silylated structures as an etch mask, removing an exposed portion of the material layer; and
removing the separate silylated structures thereby forming a plurality of separate material structures having the second pitch which is smaller than a photolithography process will allow.

17. The method of claim 16, wherein:
the plasma gas comprises oxygen; and
the removing of the-separate silylated structures does not remove a substantial portion of the material layer.

* * * * *